United States Patent
Takahashi et al.

(10) Patent No.: US 7,652,943 B2
(45) Date of Patent: Jan. 26, 2010

(54) SEMICONDUCTOR MEMORY DEVICE, TEST CIRCUIT AND TEST METHOD

(75) Inventors: Hiroyuki Takahashi, Kanagawa (JP); Atsushi Nakagawa, Kanagawa (JP); Takuya Kera, Kanagawa (JP); Masaki Miyata, Kanagawa (JP); Yasunari Kawaguchi, Kanagawa (JP); Kouichi Gotou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 432 days.

(21) Appl. No.: 11/205,194

(22) Filed: Aug. 17, 2005

(65) Prior Publication Data

US 2006/0039220 A1 Feb. 23, 2006

(30) Foreign Application Priority Data

Aug. 23, 2004 (JP) .............................. 2004-242347

(51) Int. Cl.
*G11C 7/00* (2006.01)
(52) U.S. Cl. .................. 365/222; 365/201; 365/189.04; 365/233.1
(58) Field of Classification Search ................. 365/222, 365/201, 189.04, 233.1
See application file for complete search history.

(56) References Cited

U.S. PATENT DOCUMENTS

| | | | |
|---|---|---|---|
| 5,761,703 A * | 6/1998 | Bolyn | 711/106 |
| 6,804,165 B2 * | 10/2004 | Schrogmeier et al. | 365/233.1 |
| 7,076,610 B2 * | 7/2006 | Au et al. | 711/131 |
| 7,093,047 B2 * | 8/2006 | Au et al. | 710/243 |
| 7,193,917 B2 | 3/2007 | Takahashi et al. | |
| 7,209,983 B2 * | 4/2007 | Au et al. | 710/52 |
| 2003/0026161 A1 * | 2/2003 | Yamaguchi et al. | 365/230.03 |
| 2003/0161208 A1 * | 8/2003 | Nakashima et al. | 365/222 |
| 2003/0198098 A1 * | 10/2003 | Fujioka et al. | 365/200 |
| 2004/0047209 A1 * | 3/2004 | Lien et al. | 365/202 |
| 2005/0005082 A1 * | 1/2005 | Au et al. | 711/170 |
| 2005/0105357 A1 * | 5/2005 | Oh | 365/222 |

FOREIGN PATENT DOCUMENTS

| | | |
|---|---|---|
| JP | 03-207083 | 9/1991 |
| JP | 2003-178598 A | 6/2003 |
| JP | 2003-178598 A | 6/2003 |

OTHER PUBLICATIONS http://www.necel.com/memory/japanese/products/msram/info.html>, 1 page.
Micron 4MEGx16, 2MEGx16 ASYNCH/PAGE/Burst Cellular RAM Memory, http://download.micron.com/pdf/products/psram/burst_cellularram.pdf>, pp. 5 and 10.

* cited by examiner

*Primary Examiner*—Thong Q Le
(74) *Attorney, Agent, or Firm*—Foley & Lardner LLP

(57) ABSTRACT

Disclosed is a semiconductor memory device having memory cells that are in need of refresh for data retention, includes control circuits for necessarily generating the refresh immediately before the read/write operation, and for setting the latency to a first fixed value at all times, for the first mode during the testing, and for necessarily generating the refresh immediately after the read/write operation, and for setting the latency to a second fixed value at all times, for the second mode during the testing.

23 Claims, 6 Drawing Sheets

SEMICONDUCTOR MEMORY DEVICE, TEST CIRCUIT AND TEST METHOD

FIELD OF THE INVENTION

This invention relates to a semiconductor memory device. More particularly, it relates to a semiconductor memory device, having memory cells in need of refresh for data retention, in which the access speed by refresh may be prevented from being lowered, and to a test method.

BACKGROUND OF THE INVENTION

The following analyses are given by the present invention.

Such a semiconductor memory device that comprises a cell array formed by dynamic type memory cells in need of refresh for data retention, and that is adapted to operate as a static random access memory (SRAM), has so far been in use. This type of the semiconductor memory is also termed a pseudo SRAM or a pseudostatic DRAM. There have also been developed a RAM family (termed for example MSRAM) for use of a mobile application, which is functionally compatible with the low power SRAM and which has achieved a high storage capacity by exploiting DRAM memory cells (see Non-Patent Document 1, indicated hereinbelow). With the pseudostatic DRAM, it is unnecessary to separately supply a row address and a column address, as an address, as is done in the case of a DRAM, and hence timing signals, such as RAS (row address strobe) or CAS (column address strobe) are unneeded. The semiconductor memory device of the family of the pseudostatic DRAM includes a timer for prescribing a refresh period, and a refresh address generator, and refresh is carried out by a trigger signal generated responsive to timeout of a timer. That is, the refresh operation is carried out with a preset time interval by the timer, while the timing for generation of the refresh operation usually cannot be controlled from outside. The following explanation is made on the basis of the description of the Patent Document 1.

In the pseudostatic DRAM, the self-refresh operation which is controlled by a timer, and the read/write operation which is non-periodically generated responsive to a signal entered from outside the device, occur independently of each other, such that the time durations of the two operations usually cannot be controlled from outside the device. In a well-known manner, if the self-refresh operation is temporally overlapped with the read/write operation, malfunctions are produced. These malfunctions may be exemplified by destruction of data for retention, in the case of the refresh operation, and by reading/writing of erroneous data in the case of the read/write operations. For preventing these malfunctions from occurring, such measures are taken in which, if a request of a second operation should be issued while a first operation is being carried out, the second operation is not started, but is kept to be in a wait state, until the first operation, already started, comes to a close.

For example, if a read request (read command) is issued in the course of a self-refresh operation, the read operation is not carried out for the time being and is kept in a wait state, with the read operation being carried out after the end of the self-refresh operation.

However, if the timing of generation of the self-refresh operation is close to that of the read/write operation, malfunctions may possibly be produced by interference between the operations.

Examples of these malfunctions include:
(A) interference between word lines
(B) insufficient pre-charge ascribable to shorter time durations between the operations
(C) the pulse signal generated in one operation disturbing the other operation Thus, before product shipment of the semiconductor memory device, it is necessary to carry out testing of the semiconductor memory device for checking an operation in such a condition where the self-refresh operation and the readout/write operation come close.

For coping with this problem, the Patent Document 1 discloses a method for controlling a semiconductor memory device having a plural number of memory cells that are in need of refresh for data retention, in which the timing of the refresh operation for the normal operation mode is set with the timing of generation of a refresh control signal, generated within the semiconductor memory device, as a trigger, and in which the timing of the refresh operation for the test operation mode is set, with a detection signal detecting a change in the state of an external input signal, as a trigger, so that the timing offset of the timing of the refresh operation from the timing of the read/write operation will be equal to the timing offset as set from outside.

There is also known a configuration of a semiconductor memory device employing DRAM cells and having specifications comparable to those of an SRAM, in which there is provided a WAIT pin for suspending the access from outside during execution of the internal refresh, and in which there is provided the function of handshaking with the CPU (central processing unit) via this WAIT pin (see Non-Patent Document 2, indicated hereinbelow).

FIG. 4 shows a typical configuration of a conventional semiconductor memory device (pseudostatic DRAM), including dynamic type memory cells, in need of refresh for data retention, and which is provided with the handshaking function (WAIT pin), with the device carrying out the self-refresh operations.

Referring to FIG. 4, the semiconductor memory device includes a cell array core 100, and a data I/O register 115. The cell array core includes a memory array 101, an address decoder 102 (a row address decoder and a column address decoder), and a sense amplifier/write amplifier 103. The data I/O register 115 holds input/output data for a data terminal DQ and sends write data from a data bus to the cell array core 100, while receiving read data from the cell array core 100 to output the so received data at the data terminal. The semiconductor memory device also includes a register 111 for holding an address signal, entered from an address terminal ADD, a register 112 for holding a chip select command CS, a register 113 for holding a read/write command, a register 114 for holding and outputting a WAIT signal which is output from a WAIT pin, not shown, a timer 116 which determines a refresh period, an SR flip-flop 117 which is set by a trigger signal, output on time-out of the timer 116, to output a refresh request signal in an activated state, a refresh pulse generator 118' which generates a refresh pulse signal REF responsive to the refresh request signal from the flip-flop 117, a refresh address generator 119 which generates a refresh address responsive to the refresh pulse signal REF, and a multiplexer 120 which outputs the refresh address or the input address supplied from the register 111 as a row address to the address decoder 102 (row address decoder). In addition, the semiconductor memory device includes an internal timing control circuit 121' which generates signals for controlling various timing operations of the semiconductor memory device, a read/write control circuit 122 which receives a read/write command from the register 113 to control the read/write operation, a WAIT signal generator 123 which receives signals from the internal timing control circuit 121' to generate a WAIT signal in case of occurrence of overlap of the refresh and the read/write request, a read/write pulse generator 124 which receives signals from the read/write control circuit 122 and from the internal timing control circuit 121' to generate a read/write pulse R/W, and a controller 125 which receives the read/write pulse R/W from the read/write pulse generator 124 and the refresh pulse signal REF from the refresh pulse generator 118' to generate a row enable signal RE, and controls the activation of a row-related component, for example, a selected word line, a sense enable signal SE for activating a sense amplifier, and a column enable signal CE for controlling the activation of a column-related component. In FIG. 4, CLK denotes an internal clock signal which is generated from an external clock signal for synchronization entered to the semiconductor memory device.

If, in the semiconductor memory device, a read/write command has been established (by the rising edge of the clock signal), and there is no refresh request, a read/write access is carried out, with a burst length being 8.

FIG. 5 depicts a timing diagram showing the operation of the semiconductor memory device at this time. In FIG. 5, CLK is a clock signal for synchronization, an ADD-R/W command is an address signal plus a read/write command, Refresh request is a refresh request signal, output from the SR flip-flop 117, Refresh inhibit is a refresh inhibit signal, supplied from the internal timing control circuit 121' to the refresh pulse generator 118', Core(Word) is a selected word line of the cell array core, R/W is a pulse waveform of the selected word line of the read/write access and Refresh is a pulse waveform of the selected word line corresponding to the refresh address.

In the example shown in FIG. 5, a read/write command is sampled by the register 113, while an address A0 is sampled into the register 111, at a timing t0, with the rising edge of the clock signal CLK. At this time, there is no refresh request, and the selected word line of the cell array core is activated, and hence for example, a read operation is carried out. By a read/write command input, a refresh inhibit signal from the internal timing control circuit 121' is activated to inhibit the refresh. That is, no refresh pulse is generated in the refresh pulse generator 118', supplied with the refresh inhibit signal in the activated state, and hence refresh is not executed and read/write accessing is carried out. Read-out data signals Q(0)-Q(7), with the burst length of 8, are output from the data terminal DQ, with the latency of '3', that is, from the clock cycle of the timing t3. Meanwhile, in the example shown in FIG. 5, the data signals Q(0)-Q(7) are output in synchronization with the rising and falling edges of the clock signal CLK.

The refresh pulse generator 118' (see FIG. 4), carrying out the control operation shown in FIG. 5, includes a gating circuit, such as AND circuit, not shown, which receives a refresh request signal from the flip-flop 117, and a signal obtained by inverting the refresh inhibit signal from the internal timing control circuit 121', and a one-shot pulse generator, also not shown, adapted for generating a one-shot pulse responsive to transition of the output of the gating circuit to an activated state, for example, to a high level. The internal timing control circuit 121' activates the refresh inhibit signal to a high level in case either the refresh pulse REF or the output of the register 113 (read/write access request) is in the activated state (high level). If the read/write access request is not processed and the refresh request is made first, the refresh inhibit signal is set to the activated state and kept in the activated state until the read/write operation is finished, even after the end of the refresh. In the examples shown in FIGS. 5 and 6, the internal timing control circuit 121' is configured for resetting the refresh inhibit signal from the activated state (high level) to the inactivated state (low level) by the coming to a close of the read/write operation, that is, by transition from the high level to the low level of the read/write pulse.

If, during the read/write accessing, the time out occurs in the timer 116, the refresh request is generated, and the refresh inhibit signal is in the activated state (high level), the refresh pulse generator 118' masks the input refresh request, and hence the refresh request pulse REF is not generated.

If, with a delay from the read/write operation (with the R/W pulse then going low from high), a refresh request is generated, the refresh operation is carried out. That is, when the time out occurs in the timer 116 (see 'Timer' of the 'refresh request' of FIG. 5), the flip-flop 117 is set, so that the refresh request is set to an activated state (high level). Since the refresh inhibit signal is in the inactivated state (low level) at this time, the refresh pulse generator 118', which receives the refresh request signal in the activated state as an input, outputs the refresh pulse REF and the refresh address from the refresh address generator 119 is supplied to the address decoder 102 to carry out the refresh. The refresh inhibit signal is also set to the activated state, responsive to activation of the refresh pulse REF, by the internal timing control circuit 121'. When the refresh has come to a close, that is, when the refresh pulse REF undergoes transition from the activated state (high level) to the inactivated state (low level) (see the falling transition of the 'Refresh' of the Word in FIG. 5), the refresh inhibit signal is set by the internal timing control circuit 121' to the inactivated state (low level). The flip-flop 117 is also reset, so that the refresh request signal is also reset.

If, in the semiconductor memory device, shown in FIG. 4, the refresh precedes the read/write command, the latency is '5'. The following explanation, made with reference to FIG. 6, is relevant to this semiconductor memory device.

Referring to FIG. 6, when the timer 116 has timed out (see 'Timer' of 'Refresh request' of FIG. 6), the refresh request signal is activated (goes high). Since the refresh inhibit signal is in the inactivated state (low level), the refresh pulse generator 118' generates the refresh pulse REF to carry out the refresh operation. The internal timing control circuit 121' sets the refresh inhibit signal to the activated state (high level). If the read/write command is entered at a timing t0 of FIG. 6, the read/write operation is in a wait state until the end of the refresh operation. After the refresh operation has come to a close, the read/write operation is carried out in the cell array core 100, and data is output at the data terminal DQ with the latency 5. If the refresh precedes the read/write, as shown in FIG. 6, the refresh inhibit signal is set to the activated state (high level), until the end of the read/write operation, even after the end of refresh, and is reset to an inactivated state (goes low) with the end of the read/write operation.

Thus, the latency is '3' and '5' if the read/write precedes the refresh and if the refresh precedes the read/write, respectively, such that there is caused the difference in the readout data output timing.

On the other hand, if the refresh temporally interferes with a read/write access, a WAIT signal in the activated state is output and a WAIT command for setting the WAIT state until the end of refresh is issued to the controller or to the CPU.

[Patent Document 1]
JP Patent Kokai No. JP2003-178598A
[Non-Patent Document 1]
NEC memory product information, mobile specified RAM, Internet <URL:http://www.necel.com/memory/japanese/products/msram/info.html>
[Non-Patent Document 2]
MICRON 4MEGx16, 2MEGx16 ASYNC/PAGE/Burst CellularRAM MEMORY, pages 5 and 10, Internet <URL: http://download.micron.com/pdf/products/psram/burst_cellularram.pdf>

SUMMARY OF THE DISCLOSURE

As described above, in the conventional semiconductor memory device, the latency is '3' and '5' if the read/write precedes the refresh and if the refresh precedes the read/write, respectively, such that there is caused the difference in the readout data output timing.

If the refresh request, randomly generated based on the timeout of the timer 116 in the semiconductor memory device, interferes with the read/write request from outside, the WAIT signal is output to the controller or to the CPU, as an example, to postpone the read/write operation until the end of refresh, that is, to extend the data latency). Due to this randomness, overmuch time is taken in testing for checking the interference between the read/write operation and the refresh operation, with the result that the test cost is increased, while the quality of the device can hardly be assured.

When the refresh request collides with the read/write request are temporally, such a collision is recognized by the CPU or by the tester by monitoring a WAIT signal output from the semiconductor memory device. However, if the refresh request and the read/write request do not temporally collide one on the other, the probable state of closest proximity of the read/write request to the refresh request cannot be confirmed, as a result of which the quality of the device cannot be assured correctly.

In short, it is not that easy to carry out testing of, for example, the interference between the read/write operation and the refresh, as the read/write operation and the refresh are set to the state of closest proximity to each other. If an attempt is made to conduct the testing, the result is an increased test cost, as described above.

A semiconductor memory device in accordance with one aspect of the present invention, which includes a memory cell array having a plurality of memory cells that are in need of refresh for data retention, and has the function of variably controlling the latency depending on whether the refresh is before read/write or the read/write is before refresh, comprises a control circuit for necessarily generating the refresh directly before the read/write operation, during testing, and for setting the latency to a fixed value.

According to the present invention, there may be provided a control circuit for necessarily generating the refresh directly after the read/write operation, at the time of testing, and for setting the latency to a fixed value.

A semiconductor memory device in accordance with another aspect of the present invention, which includes a memory cell array having a plurality of memory cells that are in need of refresh for data retention, and which has the function of variably controlling the latency depending on whether the refresh is before read/write or the readout is before refresh, comprises a control circuit for necessarily generating the refresh directly before the read/write operation, in a first mode, during testing, and for setting the latency to a first fixed value at all times, and for necessarily generating the refresh directly after the read/write operation, in a second mode, during testing, and for setting the latency to a second fixed value at all times.

A testing method for testing a semiconductor memory device in accordance with yet another aspect of the present invention tests a semiconductor memory device including a memory cell array having a plurality of memory cells that are in need of refresh for data retention, and having the function of variably controlling the latency depending on whether the refresh is before read/write or the read/write is before refresh. The testing method comprises a step of necessarily generating the refresh directly before the read/write operation, in a first mode, without dependency on the timing of generation of a refresh request, and for setting the latency at all times to a first fixed value, and for necessarily generating the refresh directly after the read/write operation, in a second mode, without dependency on the timing of generation of a refresh request, and for setting the latency at all times to a second fixed value.

The meritorious effects of the present invention are summarized as follows.

According to the present invention, setting may be made for compulsorily generating the refresh in the worst timing state, during testing, for thereby reducing the time and cost for testing and improving the quality of the device.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
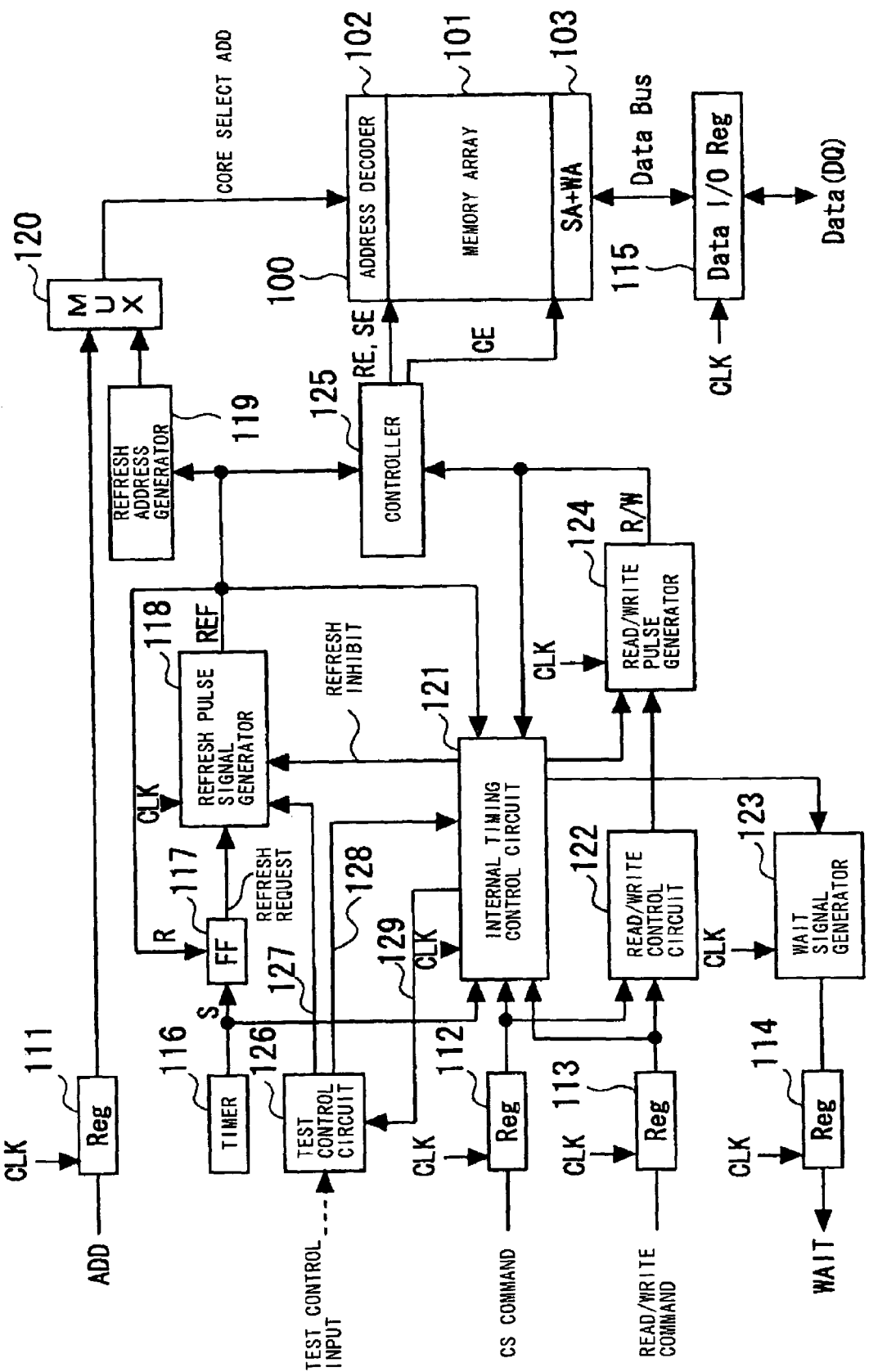
FIG. 1 is a diagram showing the configuration of a semiconductor memory device according to an embodiment of the present invention.

For elucidating the present invention in further detail, reference is made to the accompanying drawings. In an embodiment of the present invention, the relationship between the temporally forward state and the temporally backward state of the read/write and the refresh is prepared at the time of testing, in connection with the temporally preceding or succeeding states of the read/write and the refresh, such that the state of closest proximity of refresh→read/write (mode 1) and the state of closest proximity of read/write→refresh (mode 2) can be generated intentionally.

That is, in the mode 1, refresh is necessarily generated immediately before the read/write operation, and the latency is fixed at all times at a constant value, such as at 5. In the mode 2, refresh is necessarily generated immediately after the read/write operation, and the latency is fixed at all times at a constant value, such as at 3. In the mode 1, the read/write is fixedly generated immediately after the refresh to test how close the refresh can be to the read/write, whereas, in the mode 2, the read/write is fixedly generated immediately before the refresh to test how close the refresh can be to the read/write. According to the present invention, in the modes 1 and 2, in distinction from the case of the normal operation, the signal from a timer, prescribing the refresh period, is not used as a trigger for refresh.

A semiconductor memory device in an embodiment of the present invention includes a flip-flop 117 for storing a refresh request that has occurred, a refresh pulse signal generator 118 for generating a refresh signal, preferably in the form of a pulse signal, for controlling the execution of the refresh operation, an internal timing control circuit 121, responsive to the refresh signal and to the read/write access request to inhibit generation of the refresh signal by the refresh pulse signal generator, and a test control circuit 126. If, during the first mode of the test mode, a refresh request is generated, the refresh operation is not carried out at once, but the refresh request is stored in the flip-flop 117. If then a read/write command is entered, and the refresh request has been stored in the flip-flop 117, control is exercised so that the refresh pulse signal generator 118 generates a refresh signal in an activated state, responsive to the transition to the activated state of the refresh inhibit signal, so as to initiate the refresh operation in the memory cell array. When the refresh operation has come to a close, control is exercised so that the read/write operation based on the read/write command is carried out in succession.

If, during the second mode of the test mode, a refresh request is generated, the refresh operation is not carried out at once, but the refresh request is stored in the flip-flop 117. If then a read/write command is entered, the read/write operation is carried out, and the refresh inhibit signal is activated. If, when the read/write operation has come to a close, the refresh request has been stored in the flip-flop 117, the refresh pulse signal generator 118 generates a refresh signal, responsive to transition from the activated state to the inactivated state of the refresh inhibit signal, output from the internal timing control circuit 121, with the coming to a close of the read/write operation, to carry out the refresh operation. The embodiment of the present invention will now be described in detail.

Figure 4:
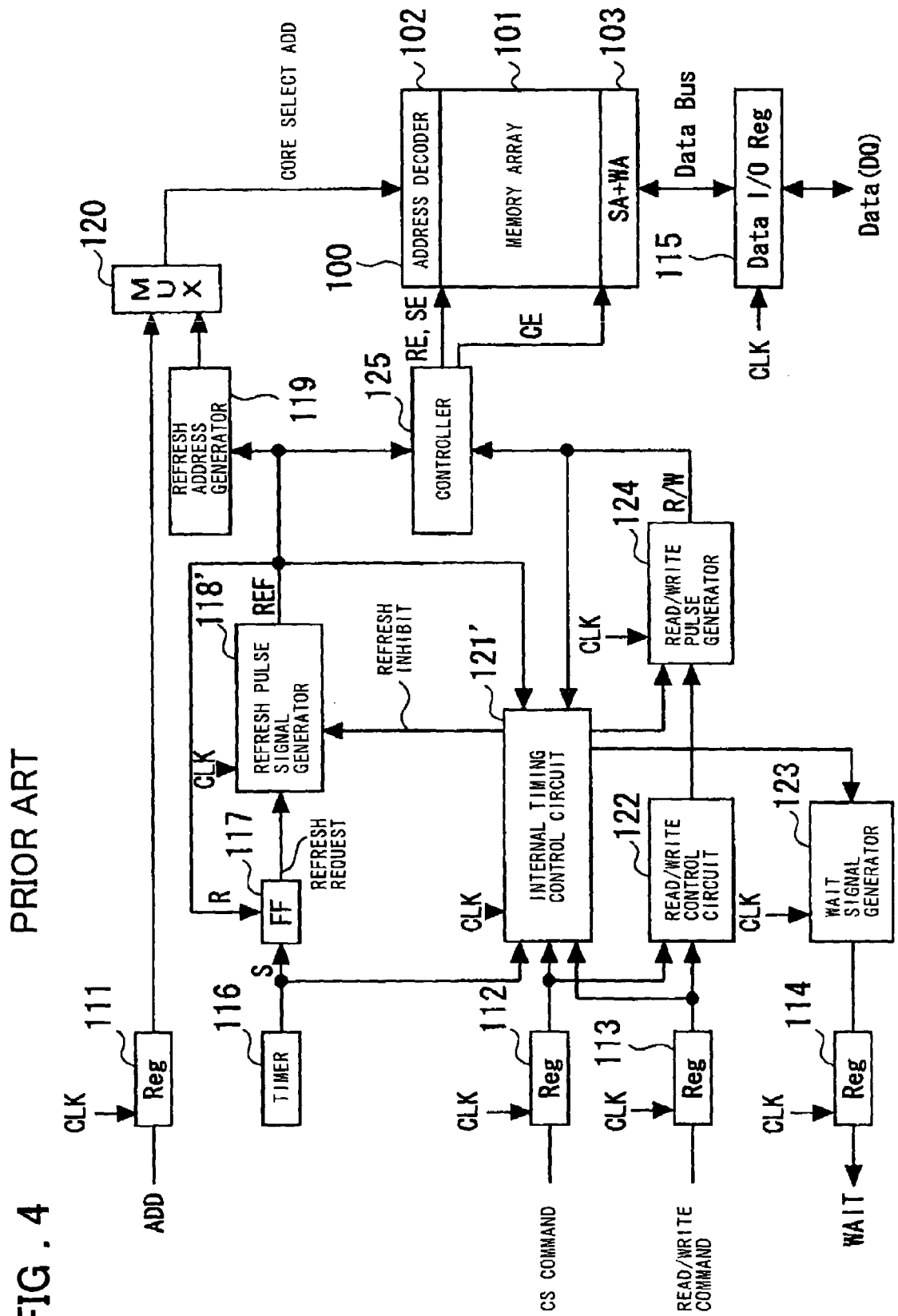
FIG. 4 is a diagram showing the configuration of a conventional semiconductor memory device.

FIG. 1 shows a configuration of a semiconductor memory device according to an embodiment of the present invention. The embodiment illustrated corresponds to the circuit of FIG. 4, to which the test control circuit 126 is added to control the refresh generation at the time of the testing. In the present embodiment shown in FIG. 1, the test control circuit 126 is provided within the semiconductor memory device, only by way of an example. The test control circuit 126 may, of course, be provided as a test circuit outside the semiconductor memory device. In the present embodiment, the description is centered about the point of difference from the configuration shown in FIG. 4, and the explanation of the same configuration is omitted for simplicity.

The test control circuit 126, responsive to a test control input to latch and decode the input. During testing, the test control circuit 12 selectively sets a first refresh generating mode in which the refresh is generated immediately before the read/write operation to regenerate a busy state (addition of latency) at all times, and a second refresh generating mode in which the refresh is generated immediately after the read/write operation to regenerate a ready state (minimum latency) at all times.

The test control circuit 126 sends control signals 127 and 128 (for the first and second refresh generating modes) to the refresh pulse signal generator 118 and to the internal timing control circuit 121. The internal timing control circuit 121 sends to the test control circuit 126 a signal 129 for controlling the output timing of the aforementioned control signals. The internal timing control circuit 121 receives the control signal 128 from the test control circuit 126 and sets the latency to a first fixed value for the first refresh generating mode of the test mode, while setting the latency to a second fixed value for the second refresh generating mode of the test mode. The internal timing control circuit notifies this to a WAIT signal generator 123. The WAIT signal generator 123 outputs a WAIT signal for a time duration corresponding to the latency of the first fixed value during the first refresh generating mode, while outputting the WAIT signal for a time duration corresponding to the latency of the second fixed value during the second refresh generating mode.

If, with the first refresh generating mode, during testing, a trigger signal is output from a timer 116, this trigger signal is stored in the flip-flop 117 as a refresh request signal. When a read/write command is entered to the command register 113, and a refresh inhibit signal in the activated state is output from the internal timing control circuit 121, the refresh pulse signal generator 118 is responsive to this signal to generate a refresh pulse to carry out the refresh operation. Following the end of the refresh operation, the readout/write operation, corresponding to the read/write command, is executed.

If, with the second refresh generating mode, during testing, a trigger signal is output from the timer 116, this trigger signal is stored in the flip-flop 117 as a refresh request signal. When a read/write command is entered to the command register 113, the read/write operation is carried out. When the read/write operation has come to a close, the refresh pulse signal generator 118 is responsive to transition from the activated state to the non-activated state of the refresh inhibit signal, output from the internal timing control circuit 121, to generate a refresh pulse to carry out the refresh operation.

Figure 5:
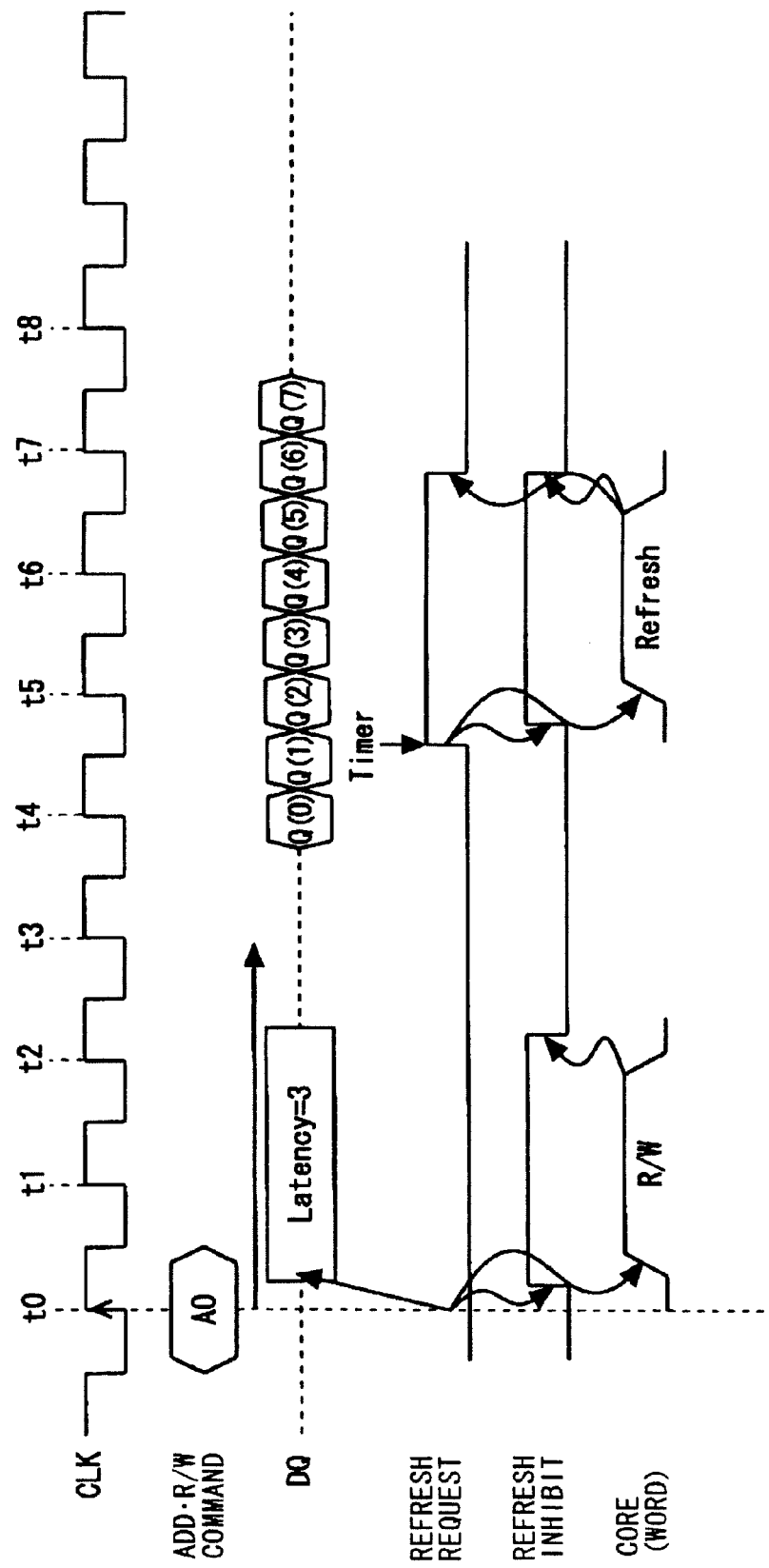
FIG. 5 is a timing diagram for illustrating the operation of a conventional semiconductor memory device.

During the normal operation, when the trigger signal from the timer 116 is output, this trigger signal is stored as a refresh request signal in the flip-flop 117. Except if the refresh inhibit signal is in the activated state, the refresh pulse signal generator 118 is responsive to the refresh request signal to generate a refresh pulse to carry out the refresh operation. Based on the refresh pulse, the refresh inhibit signal from the internal timing control circuit 121 is activated and, when the refresh operation has come to a close, the refresh inhibit signal is inactivated. This operation during the normal operation is the similar to that shown in FIG. 5.

Figure 6:
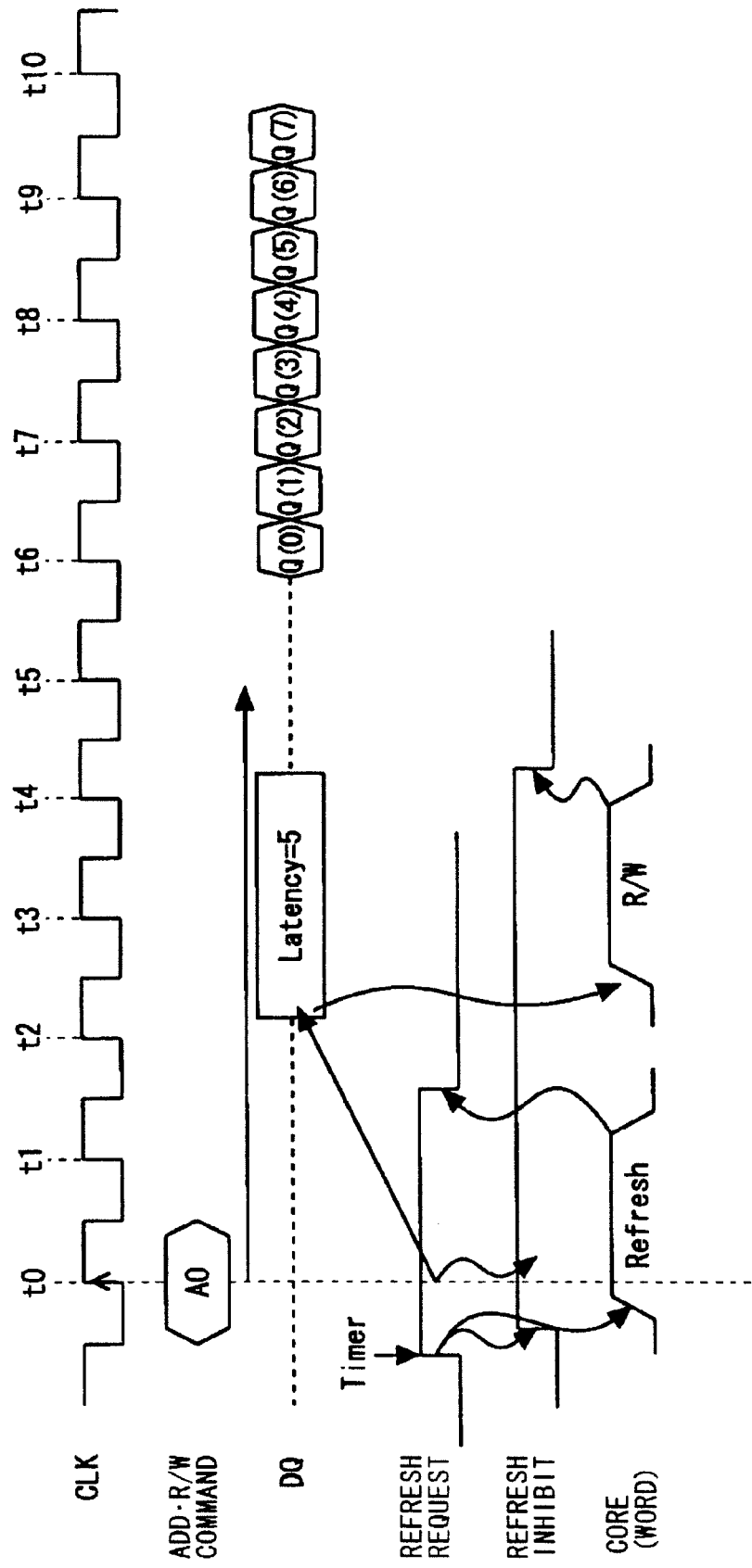
FIG. 6 is a timing diagram for illustrating the operation of a conventional semiconductor memory device.

If, during the normal operation, a trigger signal from the timer 116 is output, and subsequently a read/write command is entered, the refresh pulse signal generator 118 is responsive to the refresh request signal, set to the activated state by the trigger signal from the timer 116, to generate a refresh pulse to carry out the refresh operation. The internal timing control circuit 121 activates the refresh inhibit signal. When the refresh operation has come to a close, the internal timing control circuit 121 sets the refresh inhibit signal to the inactivated state. The read/write operation for the read/write command is subsequently carried out. This operation during the normal operation is the same as that shown in FIG. 6. During the normal operation, the latency is variably set in dependence upon whether the refresh is temporally before or after the read/write.

Figure 2:
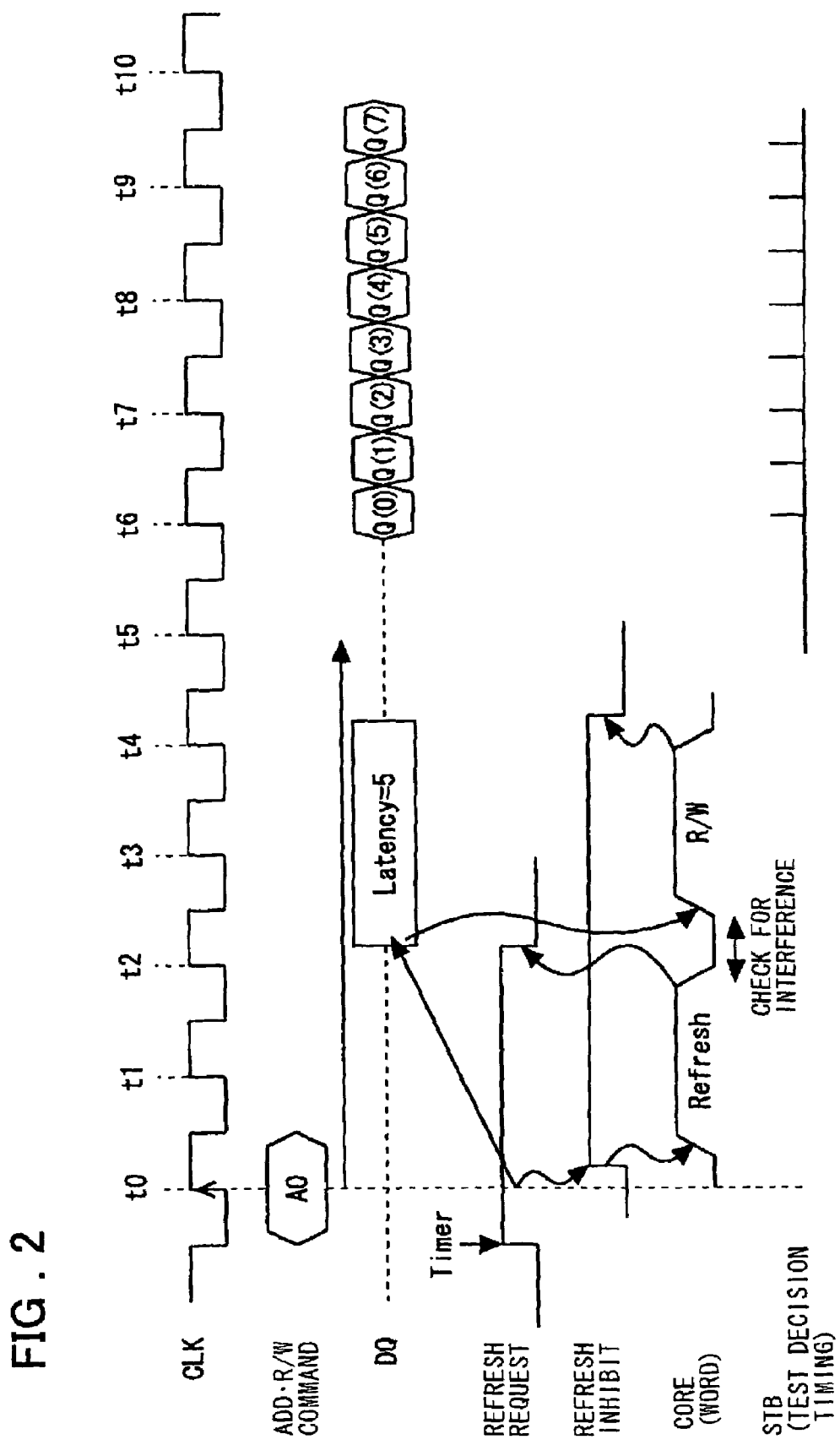
FIG. 2 is a timing diagram for illustrating the operation of the embodiment shown in FIG. 1.

FIG. 2 is a timing diagram for illustrating the operation of the first embodiment of the present invention (first refresh generating mode). In FIG. 2, CLK is a clock signal for synchronization, an ADD-R/W command is an address signal plus a read/write command, Refresh request is a refresh request signal, output from the SR flip-flop 117, Refresh inhibit is a refresh inhibit signal, supplied from the internal timing control circuit 121 to the refresh pulse generator 118, Core(Word) is pulse waveform on a selected word line of a cell array core, R/W is a pulse waveform of the selected word line of the read/write access and Refresh is a pulse waveform on the selected word line corresponding to the refresh address. Meanwhile, STB (test decision timing) is a strobe timing signal (signal provided within the tester) for comparing read data from a DQ terminal with an expected value data by a comparator of the tester.

In the example shown in FIG. 2, the refresh operation is not carried out immediately at a time point of generation of the refresh request from the timer 116 during testing (this time point is indicated by an arrow 'Timer' in the 'Refresh request' of FIG. 2). When the read/write access and an address A0 are sampled in the command register 113 and in a register 111, and the refresh inhibit signal in the activated state (high level) is output from the internal timing control circuit 121 to the refresh pulse signal generator 118, the refresh pulse REF is output to carry out the refresh operation of a cell array core 100. In contrast thereto, if, during the normal operation, a refresh request is generated by timeout of the timer 116, as in FIG. 5, and the refresh request does not temporally overlaps with the read/write access, a refresh pulse REF is output from the refresh pulse signal generator 118. In response thereto, the internal timing control circuit 121 outputs a refresh inhibit signal in the activated state (high level).

Referring again to FIG. 2, when the refresh pulse REF goes low, such that the refresh request is at a low level, the read operation is started from the cycle of a timing t2 when two clock cycles have elapsed as from timing t0. After the end of the read/write operation, the internal timing control circuit 121 sets the refresh request signal to an inactivated state (low level). Read data Q(0) to Q(7) are output, with a latency 5, from the data terminal DQ, with the burst length equal to 8, so as to be compared with the expected value data, at the timing of an strobe signal STB, by the comparator of the tester, not shown.

As for the frequency of refresh generation, a trigger signal, entered from outside, may be used in place of the timer 116. In this case, a selector circuit for selecting the trigger signal entered from outside or the trigger signal from the timer 116 is provided in a stage preceding to the flip-flop 117. For testing, the trigger signal entered from outside is selected. In this case, the timing of the refresh operation may be set from outside in a desired manner.

Figure 3:
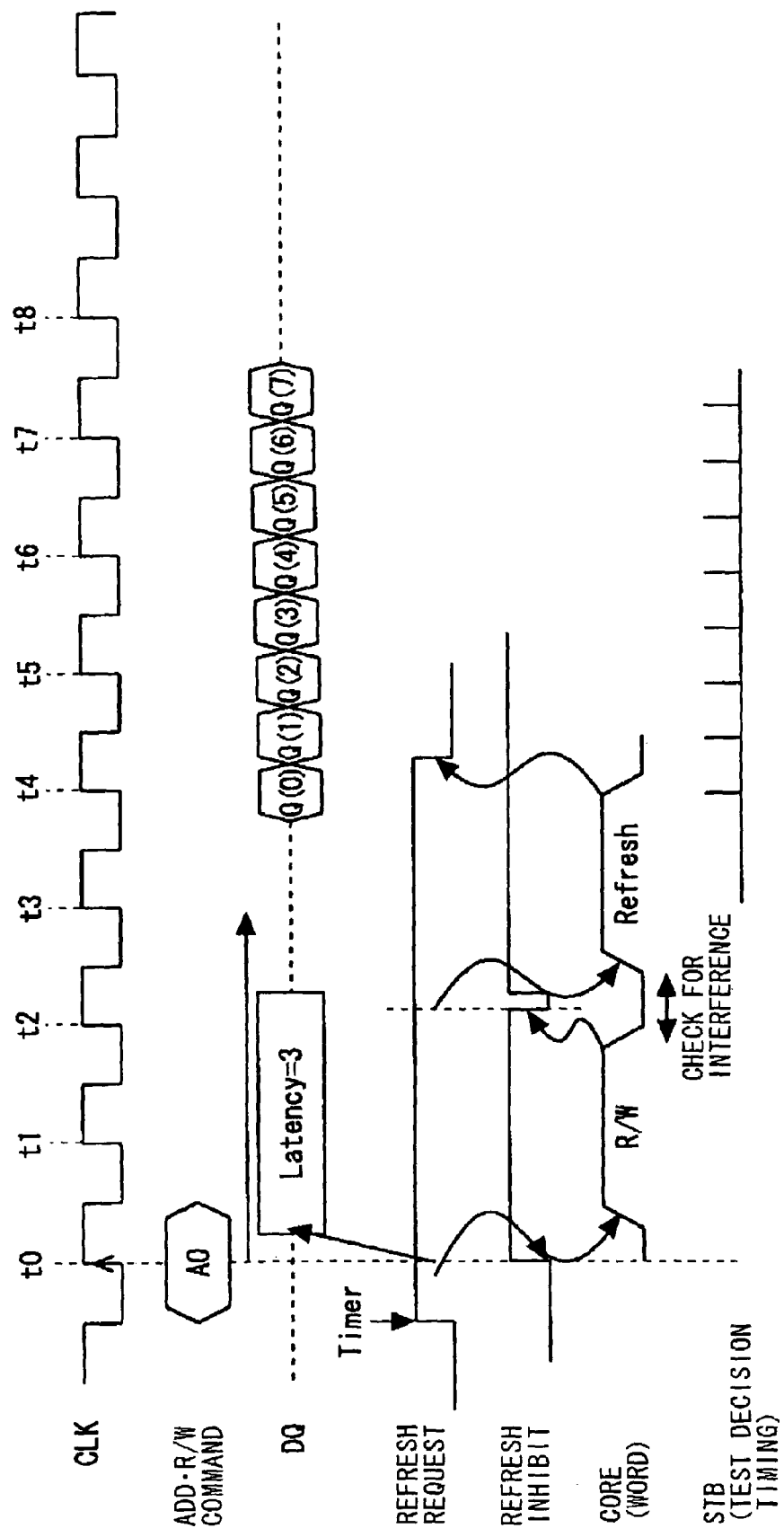
FIG. 3 is a timing diagram for illustrating the operation of the embodiment shown in FIG. 1.

FIG. 3 is a timing diagram for illustrating the operation of the embodiment of the present invention in the second mode of refresh generation. With the release of the refresh inhibit signal, directly following the read/write access, as a trigger, refresh is carried out in direct succession to the read/write access. That is, in the present embodiment, the timeout of the timer 116 is not used as a trigger for refresh. The refresh request (see the arrow 'Timer' of the 'Refresh request' of FIG. 3) is stored in the flip-flop 117. When the read/write access and the address are sampled at a timing t0 in the command register 113 and in the address register 111 respectively, the read/write operation is carried out, and the selected word line is activated (see the selected word line R/W of 'Core Word' of FIG. 3). After the completion of the read/write operation, the refresh inhibit signal from the internal timing control circuit 121 is reset from the activated state (high level) to the inactivated state (low level). With this resetting as a trigger, the refresh pulse signal generator 118 outputs the refresh pulse REF to carry out the refresh operation. The refresh inhibit signal is again activated at this time and, with the end of the refresh, the refresh inhibit signal is inactivated. The read data is output, with the latency 3, from the data terminal DQ.

With the present embodiment, the state of mutual interference between the refresh and the read/write operations may be checked, at the time of testing, as the refresh and the read/write operations are brought to the state of closest proximity to each other, as shown in FIGS. 2 and 3, thus improving the quality of the device.

The refresh pulse generator 118 includes a circuit for exercising control for generating the refresh pulse REF by a one-shot pulse generator, not shown, when the refresh request signal is in an activated state, in the first refresh generating mode, based on a rising edge of the refresh inhibit signal. The refresh pulse generator 118 also includes a circuit for exercising control for generating the refresh pulse REF by a one-shot pulse generator, not shown, when the refresh request signal is in an activated state, in the second refresh generating mode, by way of an example, based on a falling edge of the refresh inhibit signal. The refresh pulse generator 118 also includes a circuit for exercising control during the normal operation for generating the refresh pulse REF by the one-shot pulse generator, not shown, when the refresh inhibit signal is in an activated state, with the refresh request signal being in the activated state. Only by way of an example, the refresh pulse generator 118 may be configured for controlling these circuits in a switching fashion to output the refresh pulse based on a control signal 127 prescribing the usual mode and the first and second refresh generating modes in the test mode.

Although the present invention has been explained in the foregoing with reference to the preferred embodiments thereof, the present invention is not to be limited to the configuration of the specified embodiments and may include various changes or corrections that may come within the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device including a memory cell array having a plurality of memory cells that are in need of refresh for data retention, said semiconductor memory device further comprising
    a test control circuit for necessarily generating the refresh in a fixed sequence with regard to a read/write operation, during testing, to set the latency to a fixed value;
    wherein said semiconductor memory device variably controls latency depending on whether refresh is before read/write or read/write is before refresh,
    wherein the refresh is necessarily generated directly before the read/write operation or directly after the read/write operation.

2. The semiconductor memory device according to claim 1, wherein said test control circuit necessarily generates the refresh directly before the read/write operation, in a first mode, during the testing, thereby setting the latency to a first fixed value at all times; and necessarily generates the refresh directly after the read/write operation, in a second mode, during the testing, thereby setting the latency to a second fixed value at all times.

3. The semiconductor memory device according to claim 1, further comprising:

a flip-flop for storing a refresh request;

a circuit for exercising control so that, if, during the testing, a refresh request is generated, the refresh operation is not carried out at once and said refresh request is stored in said flip-flop; and for exercising control so that, when a read/write command is entered, and said refresh request is stored in said flip-flop, refresh operation is carried out and said read/write operation is carried out in succession to the end of said refresh operation; and so that the refresh is necessarily carried out first and so that said read/write operation is carried out directly thereafter.

4. The semiconductor memory device according to claim 1, further comprising:

a flip-flop for storing a refresh request on occurrence thereof;

a refresh signal generating circuit for generating a refresh signal adapted for controlling the execution of a refresh operation; and a timing control circuit responsive to said refresh signal and a read/write access request to output a refresh inhibit signal inhibiting the generation of said refresh signal in said refresh signal generating circuit; wherein said semiconductor memory device further comprises:

a circuit for exercising control so that, if, during the testing, said refresh request is generated, the refresh operation is not carried out at once and said refresh request is stored in said flip-flop, when a read/write command is entered, and said refresh request is stored in said flip-flop, said refresh signal generating circuit performs control to generate a refresh signal in an activated state, responsive to transition to an activated state of said refresh inhibit signal, to cause the refresh operation in said memory cell array to be started; and so that after the end of said refresh operation, the read/write operation based on said read/write command is carried out in succession to the end of said refresh operation.

5. The semiconductor memory device according to claim 1, further comprising:

a timer for outputting a trigger signal every preset refresh period;

a flip-flop for storing said trigger signal from said timer to store the signal as a refresh request signal;

a refresh pulse generating circuit supplied with the refresh request signal from said flip-flop to generate a refresh pulse based on an input refresh inhibit signal;

a refresh address generating circuit receiving a refresh pulse output from said refresh pulse generating circuit to generate a refresh address; and a timing control circuit for generating a refresh inhibit signal in an activated state at the time of refresh and read/write access; wherein when the trigger signal is output from said timer, at the time of testing, said trigger signal is stored as a refresh request signal in said flip-flop; said refresh pulse generating circuit generating a refresh pulse to carry out the refresh operation responsive to inputting of a read/write command and to activation of said refresh inhibit signal from said timing control circuit; and wherein the read/write operation corresponding to said read/write command is carried out in succession to the end of said refresh operation.

6. The semiconductor memory device according to claim 5, wherein if, during a normal operation, said trigger signal from said timer is output, said trigger signal is stored in said flip-flop as said refresh request signal;

if said refresh inhibit signal is not in an activated state, said refresh pulse generating circuit is responsive to said refresh request signal to generate a refresh pulse to carry out the refresh operation; and wherein said refresh inhibit signal from said timing control circuit is activated, based on said refresh pulse, said refresh inhibit signal being inactivated with the end of the refresh operation.

7. The semiconductor memory device according to claim 1, further comprising:

a flip-flop for storing a refresh request;

a circuit for exercising control so that, if, during testing, a refresh request is generated, the refresh operation is not carried out at once, and said refresh request is stored in said flip-flop; and for exercising control so that the read/write operation is carried out when the read/write command is entered; if, at the time of the end of the read/write operation, said refresh request is stored in the flip-flop, said refresh is carried out in succession; and so that the read/write operation is necessarily carried out first and, directly thereafter, said refresh is executed.

8. The semiconductor memory device according to claim 1, further comprising:

a flip-flop for storing a refresh request on occurrence thereof;

a refresh signal generating circuit for generating a refresh signal adapted for controlling the execution of a refresh operation; and a timing control circuit responsive to said refresh signal and a read/write access request for outputting a refresh inhibit signal inhibiting the generation of said refresh signal in said refresh signal generating circuit; wherein if, during the testing, a refresh request is generated, the refresh operation is not carried out at once, said refresh request being stored in a flip-flop;

when a read/write command is entered, the read/write operation is carried out and said refresh inhibit signal is activated; and wherein if, when the read/write operation has come to a close, said refresh request is stored in said flip-flop, said refresh signal generating circuit is responsive to transition from the activated state to the inactivated state of said refresh inhibit signal from said timing control circuit to generate a refresh signal in the activated state to execute the refresh operation.

9. The semiconductor memory device according to claim 1, further comprising:

a timer for outputting a trigger signal every preset refresh period;

a flip-flop for storing said trigger signal from said timer to store the signal as the refresh request signal;

a refresh pulse generating circuit receiving a refresh request signal from said flip-flop to generate the refresh pulse based on an input refresh inhibit signal;

a refresh address generating circuit receiving a refresh pulse output from said refresh pulse generating circuit to generate a refresh address; and a timing control circuit for generating a refresh inhibit signal in an activated state at the time of refresh and read/write access; wherein when the trigger signal is output from said timer, at the time of testing, said trigger signal is stored as a refresh request signal in said flip-flop;

if subsequently the read/write command is entered, the read/write operation is carried out, and wherein said refresh pulse generating circuit generates a refresh pulse, responsive to transition from the activated state to the inactivated state of said refresh inhibit signal output from said timing control circuit, with the end of said read/write operation, to carry out the refresh operation.

10. The semiconductor memory device according to claim 9, wherein if, during a normal operation, a trigger signal from said timer is output and subsequently a read/write command is entered, said refresh pulse generating circuit, on receipt of a refresh request signal, set to an activated state by the trigger signal from said timer, generates a refresh pulse to carry out the refresh operation, and said timing control circuit activates the refresh inhibit signal; and wherein when the refresh operation has come to a close, said timing control circuit inactivates said refresh inhibit signal, and subsequently the read/write operation corresponding to the read/write command is carried out.

11. The semiconductor memory device according to claim 5, wherein said refresh request is entered from outside the semiconductor memory device.

12. The semiconductor memory device according to claim 6, further comprising a circuit for receiving a test control signal; wherein the normal operation and the test operation is controlled by said test control signal.

13. The semiconductor memory device according to claim 1, wherein said test control circuit generates the refresh responsive to a read/write command input, without dependency on the timing of generation of a refresh request, to fix the latency in a first duration during a first test mode, and generates the refresh responsive to the end of the read/write operation, without dependency on the timing of generation of a refresh request, to fix the latency in a second duration which is shorter than the first duration during a second test mode.

14. A test circuit for testing a semiconductor memory device including a memory cell array having a plurality of memory cells that are in need of refresh for data retention, said test circuit comprising:

a circuit for receiving a test control signal; and a test control circuit for necessarily generating the refresh in a fixed sequence with regard to the read/write operation, without dependency on the timing of generation of a refresh request, to set the latency to a fixed value, when said test control signal indicates a test mode;

wherein said semiconductor memory device variably controls the latency depending on whether the refresh is before read/write or the read/write is before refresh, wherein the test control circuit necessarily generates the refresh directly before the read/write operation or directly after the read/write operation.

15. The test circuit according to claim 14, wherein said test control circuit necessarily generates the refresh directly before the read/write operation, in a first mode, at the time of testing of said semiconductor memory device, without dependency on the timing of generation of the refresh request, thereby setting the latency at all times to a first fixed value; and necessarily generates the refresh directly after the read/write operation, in a second mode, without dependency on the timing of generation of the refresh request, thereby setting the latency at all times to a second fixed value.

16. The test circuit according to claim 14, wherein said test control circuit generates the refresh responsive to a read/write command input, without dependency on the timing of generation of a refresh request, to fix the latency in a first duration during a first test mode, and generates the refresh responsive to the end of the read/write operation, without dependency on the timing of generation of a refresh request, to fix the latency in a second duration which is shorter than the first duration during a second test mode.

17. A test method for testing a semiconductor memory device including a memory cell array having a plurality of memory cells that are in need of refresh for data retention, said test method comprising the steps of:

receiving a test control signal; and generating the refresh necessarily in a fixed sequence with regard to the read/write operation, without dependency on the timing of generation of a refresh request, to set the latency to a fixed value, when said test control signal indicates a test mode;

whereby the interference between the refresh and the read/write operation in said semiconductor memory device is testable;

wherein said semiconductor memory device having a function of variably controlling the latency depending on whether the refresh is before read/write or the read/write is before refresh, wherein the generating the refresh necessarily generates the refresh directly before the read/write operation or directly after the read/write operation.

18. The testing method according to claim 17, comprising the steps of:

necessarily generating the refresh directly before the read/write operation, in a first mode, without dependency on the timing of generation of a refresh request, and for setting the latency at all times to a first fixed value, and necessarily generating the refresh directly after the read/write operation, in a second mode, without dependency on the timing of generation of a refresh request, and for setting the latency at all times to a second fixed value.

19. The method according to claim 17, comprising the steps of:

generating the refresh responsive to a read/write command input, without dependency on the timing of generation of a refresh request, to fix the latency in a first duration during a first test mode;

generating the refresh responsive to the end of the read/write operation, without dependency on the timing of generation of a refresh request, to fix the latency in a second duration which is shorter than the first duration during a second test mode; and determining a proximity state of the refresh to the read/write operation by comparing a subsequent read/write access to an expected value.

20. A semiconductor memory device including a memory cell array having a plurality of memory cells that are in need of refresh for data retention, said test method comprising:

receiving means for receiving a test control signal; and generating means for generating the refresh necessarily in a fixed sequence with regard to the read/write operation such that the refresh is generated directly before the read/write operation or directly after the read/write operation, without dependency on the timing of generation of a refresh request, to set the latency to a fixed value, when said test control signal indicates a test mode;

whereby the interference between the refresh and the read/write operation in said semiconductor memory device is testable;

control means for variably controlling the latency depending on whether the refresh is before read/write or the read/write is before refresh.

21. The semiconductor memory device according to claim 20, further comprising:

storage means for storing a refresh request;

circuit control means for exercising control so that, if, during the testing, a refresh request is generated, the refresh operation is not carried out at once and said refresh request is stored in said storage means; and for exercising control so that, when a read/write command is entered, and said refresh request is stored in said storage means, refresh operation is carried out and said read/write operation is carried out in succession to the end of said refresh operation; and so that the refresh is necessarily carried out first and so that said read/write operation is carried out directly thereafter.

22. The semiconductor memory device according to claim 20, further comprising:

storage means for storing a refresh request on occurrence thereof;

refresh signal generating means for generating a refresh signal adapted for controlling the execution of a refresh operation; and timing control means responsive to said refresh signal and a read/write access request to output a refresh inhibit signal inhibiting the generation of said refresh signal in said refresh signal generating circuit; wherein said semiconductor memory device further comprises:

circuit control means for exercising control so that, if, during the testing, said refresh request is generated, the refresh operation is not carried out at once and said refresh request is stored in said storage means, when a read/write command is entered, and said refresh request is stored in said storage means, said refresh signal generating means performs control to generate a refresh signal in an activated state, responsive to transition to an activated state of said refresh inhibit signal, to cause the refresh operation in said memory cell array to be started; and so that after the end of said refresh operation, the read/write operation based on said read/write command is carried out in succession to the end of said refresh operation.

23. The semiconductor memory device according to claim 20, wherein said generating means generates the refresh responsive to a read/write command input, without dependency on the timing of generation of a refresh request, to fix the latency in a first duration during a first test mode, and generates the refresh responsive to the end of the read/write operation, without dependency on the timing of generation of a refresh request, to fix the latency in a second duration which is shorter than the first duration during a second test mode.

* * * * *